US011053589B2

(12) United States Patent
Kim et al.

(10) Patent No.: US 11,053,589 B2
(45) Date of Patent: Jul. 6, 2021

(54) MULTI-INLET GAS DISTRIBUTOR FOR CHEMICAL VAPOR DEPOSITION COATING OF TRISO PARTICLES

(71) Applicant: X-Energy, LLC., Greenbelt, MD (US)

(72) Inventors: Howard Kim, Knoxville, TN (US); Peter J. Pappano, Poolesville, MD (US)

(73) Assignee: X-Energy, LLC, Rockville, MD (US)

( * ) Notice: Subject to any disclaimer, the term of this patent is extended or adjusted under 35 U.S.C. 154(b) by 243 days.

(21) Appl. No.: 16/017,291

(22) Filed: Jun. 25, 2018

(65) Prior Publication Data

US 2019/0003051 A1 Jan. 3, 2019

Related U.S. Application Data

(60) Provisional application No. 62/526,014, filed on Jun. 28, 2017.

(51) Int. Cl.
| | |
|---|---|
| *C23C 16/455* | (2006.01) |
| *C23C 16/442* | (2006.01) |
| *C23C 16/44* | (2006.01) |
| *C04B 35/626* | (2006.01) |
| *C04B 35/16* | (2006.01) |
| *C04B 35/653* | (2006.01) |
| *G21C 3/62* | (2006.01) |

(52) U.S. Cl.
CPC ........ *C23C 16/45563* (2013.01); *C04B 35/16* (2013.01); *C04B 35/62645* (2013.01);
(Continued)

(58) Field of Classification Search
CPC .......... C23C 16/45563; C23C 16/4417; C23C 16/442; C23C 16/45506
See application file for complete search history.

(56) References Cited

U.S. PATENT DOCUMENTS

| | | |
|---|---|---|
| 2,990,260 A | 6/1961 | Mungen |
| 3,636,923 A | 1/1972 | Mccreary et al. |

(Continued)

FOREIGN PATENT DOCUMENTS

| | | |
|---|---|---|
| EP | 0684871 B1 | 5/1998 |
| WO | 2012/042327 A1 | 4/2012 |
| WO | 2014/035878 A1 | 3/2014 |

OTHER PUBLICATIONS

International Preliminary Report on Patentability (Chapter 1 of the Patent Cooperation Treaty) in related International Application No. PCT/US2018/039422 dated Jan. 9, 2020.
(Continued)

*Primary Examiner* — Kelly M Gambetta
(74) *Attorney, Agent, or Firm* — The Marbury Law Group, PLLC

(57) ABSTRACT

A multi-inlet gas distributor for a fluidized bed chemical vapor deposition reactor that may include a distributor body having an inlet surface, an exit surface opposed to the inlet surface, and a side perimeter surface. The distributor body may also include multiple-inlets evenly spaced from each other, wherein the multiple-inlets penetrate the distributor body from the inlet surface to a first depth. The distributor body may additionally include cone-shaped apertures connecting to corresponding ones of the multiple-inlets at the first depth and extend from the first depth toward the exit surface. An apex may be formed on the exit surface at the intersection of the cone-shaped apertures.

19 Claims, 4 Drawing Sheets

(52) U.S. Cl.
CPC ...... *C04B 35/62675* (2013.01); *C04B 35/653* (2013.01); *C23C 16/442* (2013.01); *C23C 16/4417* (2013.01); *C23C 16/45506* (2013.01); *C04B 2235/3224* (2013.01); *C04B 2235/3227* (2013.01); *C04B 2235/3229* (2013.01); *C04B 2235/3298* (2013.01); *C04B 2235/3418* (2013.01); *C04B 2235/36* (2013.01); *C04B 2235/442* (2013.01); *G21C 3/626* (2013.01)

(56) References Cited

U.S. PATENT DOCUMENTS

2004/0052692 A1\* 3/2004 Hottovy .................... B01J 8/44
422/143
2012/0230903 A1\* 9/2012 Kulkarni ............... C01B 33/027
423/349

OTHER PUBLICATIONS

International Search Report and Written Opinion of the International Search Authority for International Application No. PCT/US2018/039422, dated Oct. 8, 2018, 15 pages.
Communication pursuant to Rules 70(2) and 70a(2) EPC received from the European Patent Office in related European Application No. 1882428.4-1104 / 3646344 PCT/US2018/039422 dated Oct. 16, 2020.
Extended European Search Report received from the European Patent Office in related European Application No. 1882428.4-1104 / 3646344 PCT/US2018/039422 dated Sep. 29, 2020.

\* cited by examiner

MULTI-INLET GAS DISTRIBUTOR FOR CHEMICAL VAPOR DEPOSITION COATING OF TRISO PARTICLES

RELATED APPLICATIONS

This application claims the benefit of U.S. Provisional Patent Application 62/526,014 entitled "MULTI-INLET GAS DISTRIBUTOR FOR CHEMICAL VAPOR DEPOSITION COATING OF TRISO PARTICLES," filed Jun. 28, 2017, the entire contents of which is hereby incorporated by reference for all purposes.

BACKGROUND

High temperature gas-cooled nuclear reactors employ nuclear fuel in the form of particles (referred to herein as "nuclear fuel particles") that are embedded in a graphite matrix, which may be in the form of spheres (or "pebbles") or graphite blocks. Individual nuclear fuel particles are coated multilayer structures with a nuclear fuel kernel at the center surrounded by multiple layers of ceramic and graphite materials. The nuclear fuel kernel may be formed of a fissionable oxide (e.g., UCO, $UO_2$, $UC_2$, $UO_2/UC_2$, or $ThO_2/UO_2$) surrounded by a buffer layer, which may include a porous carbon material such as graphite. The buffer layer accommodates fuel kernel expansion and serves as a reservoir for fission gases. The buffer layer is surrounded by a dense inner carbon layer, e.g., a layer of pyrolytic carbon. The inner carbon layer seals the buffer layer and attenuates migration of radionuclides. The inner carbon layer is surrounded by a ceramic layer, e.g., a layer of silicon carbide or zirconium carbide. The ceramic layer contains fission products, thereby preventing fission products from migrating out of the kernel, and improves structural rigidity. The ceramic layer is covered by an outer carbon layer that may also contain pyrolytic carbon. The outer carbon layer acts as a further barrier to fission gas release. Such nuclear fuel particles are generally referred to as TRIstructural-ISOtropic (TRISO) fuel particles. The multilayer structure of TRISO fuel particles have been well tested in high-temperature gas cooled reactors (HTGR) designs, and exhibit very good performance for retaining fission products under extreme temperature conditions.

The multiple layers of ceramic and graphite materials may be applied to the nuclear fuel kernel in a fluidized bed chemical vapor deposition (CVD) reactor.

One problem in manufacturing TRISO fuel particles involves decreased yield that may occur because of "dead zones" within the fluidized bed CVD reactor chamber where gas flow stalls or stagnates causing the TRISO fuel particles to become static and not spin. In such dead zones where there is inadequate fluidization, nuclear fuel particles may not be coated properly, leading to missing layers or defective layers, thus lower yields of the CVD processes.

SUMMARY

Various embodiments may include a multi-inlet gas distributor for a fluidized bed chemical vapor deposition reactor that may include a distributor body having an inlet surface, an exit surface opposed to the inlet surface, and a side perimeter surface. The distributor body may also include multiple-inlets evenly spaced from each other, wherein the multiple-inlets penetrate the distributor body from the inlet surface to a first depth. The distributor body may additionally include cone-shaped apertures connecting to corresponding ones of the multiple-inlets at the first depth and extend from the first depth toward the exit surface. An apex may be formed on the exit surface at the intersection of the cone-shaped apertures.

In some embodiments, an apex ridge may be formed between the intersection of each of adjacent ones of the cone-shaped apertures. The apex ridge may extend between the side perimeter surface and the apex. The multiple-inlets may be evenly spaced from a center of the exit surface. A saddle may be formed on an edge of the exit surface at an intersection of at least one of the cone-shaped apertures with the side perimeter surface. Shoulders may be formed on the exit surface where two adjoining cone-shaped apertures intersect, but do not also intersect with the side perimeter surface. A peak may be formed at an intersection of two adjoining ones of the cone-shaped apertures with the side perimeter surface. An overall thickness of the distributor body may be between 1.25 and 2.30 inches. The first depth of the multiple-inlets may be 0.25 inches. An outside diameter of the multiple-inlets may be 7/64th inch. A radius of the distributor body, between a center thereof and the side perimeter surface, may be 0.5 inches. An outside diameter of the distributor body may be between 2.0 inches and 6.0 inches. An outside diameter of the distributor body may be 2.0 inches. The cone-shaped apertures may be right circular cones. The right circular cones may have an interior angle of between 45° and 55°. A cross-section of the multi-inlet gas distributor may have a shape selected from the group consisting of a circle, a triangle, a square, a pentagon, a hexagon, or an octagon. The distributor body may be formed from one or more materials selected from the group consisting of graphite, aluminum, steel, titanium, alloy-steel, plastic, or polymer.

Further embodiments may include a fluidized bed chemical vapor deposition reactor that include a fluidized bed chamber configured to hold fluidizing gas/vapor and a multi-inlet gas distributor coupled to the fluidized bed chamber. The multi-inlet gas distributor may be configured to receive the fluidizing gas/vapor through the multiple-inlets and inject the fluidizing gas/vapor through the cone-shaped apertures and into the fluidized bed chamber.

BRIEF DESCRIPTION OF THE DRAWINGS

The accompanying drawings are presented to aid in the description of embodiments of the disclosure and are provided solely for illustration of the embodiments and not limitation thereof.

DETAILED DESCRIPTION

Various embodiments will be described in detail with reference to the accompanying drawings. Wherever possible, the same reference numbers will be used throughout the drawings to refer to the same or like parts. References made to particular examples and implementations are for illustrative purposes and are not intended to limit the scope of the invention or the claims. Alternate embodiments may be devised without departing from the scope of the disclosure. Additionally, well-known elements of the disclosure will not be described in detail or will be omitted so as not to obscure the relevant details of the disclosure.

Various embodiments include a multi-inlet gas distributor for use within a fluidized bed CVD reactor chamber that improves coating of particles suspended within the fluidized bed by mitigating the potential dead zones. Multiple inlets within the gas distributor may be connected to diverging cone-shaped surfaces to provide better distribution of the fluidizing gas/vapor. The use of multiple inlets each having a cone-shape provides more consistent flow across the diameter of larger sized fluidized bed CVD reactor chambers (i.e., 6-10 inch diameter chambers), thereby mitigating dead zones where inadequate suspension of the fluidized bed may occur. Better suspension across the full diameter of the fluidized bed CVD reactor chamber may promote the reduction or elimination of dead zones, higher production rates, lower cost, and improved quality CVD-coated particles than is achievable with conventional fluidized bed CVD reactors.

Figure 1:
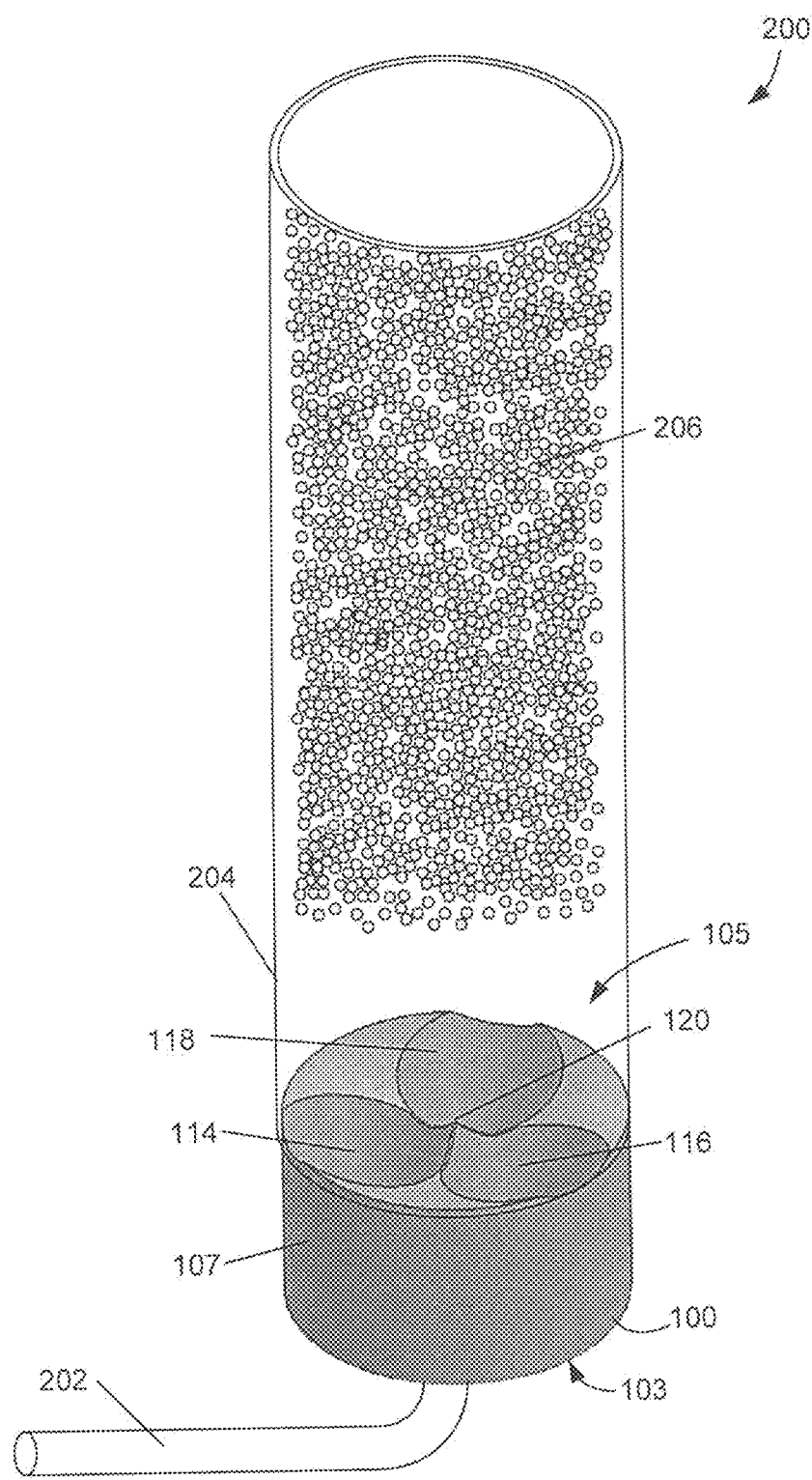
FIG. 1 illustrates a perspective view of a fluidized bed CVD reactor suitable for use with the various embodiments.

FIG. 1 illustrates a fluidized bed CVD reactor providing enhanced fluidization and coating of TRISO fuel particles in accordance with various embodiments. TRISO fuel particles 206 may be suspended in a fluidized bed chamber 204 by gasses flowing into a fluidized bed CVD reactor 200. The TRISO fuel particles 206 may be coated in a batch process in the fluidized bed chamber 204. The TRISO fuel particles 206 may be suspended in the fluidized bed chamber 204 from below by injection of a fluidizing gas/vapor into the fluidized bed chamber 204 via multi-inlet gas distributor 100. The fluidizing gas/vapor may be supplied to the multi-inlet gas distributor 100 via a supply tube 202 or tubes. The fluidizing gas/vapor may include compounds such as hydrogen gas, argon, acetylene, propylene, and methyltrichlorosilane (MTS). The fluidizing gas/vapor exits the supply tube 202 into a manifold (not shown) or into separate tubes (not shown) for injection directly into inlets of the multi-inlet gas distributor 100.

The multi-inlet gas distributor 100 may include a distributor body 102 having an inlet surface 103 and an exit surface 105 opposite the inlet surface 103. In addition, the distributor body 102 may include three cone-shaped apertures 114, 116, 118 connecting to corresponding ones of multiple-inlets formed in the inlet surface 103. The three cone-shaped apertures 114, 116, 118 may extend and diverge from the multiple-inlets toward the exit surface 105 and form an apex 120. In some embodiments, the multi-inlet gas distributor 100 may have two or more than three cone-shaped apertures. As illustrated, the cone-shaped apertures 114, 116, 118 may be distributed across the multi-inlet gas distributor 100 so as to distribute the fluidizing gas/vapor approximately evenly across the diameter of the fluidized bed chamber 204. In this manner, the distribution of the fluidizing gas/vapor emanating from three cone-shaped apertures 114, 116, 118 may reduce or eliminate dead zones within the fluidized bed chamber 204, thereby enabling a higher percentage of TRISO fuel particles 206 to receive proper coatings during a CVD process.

Figure 2:
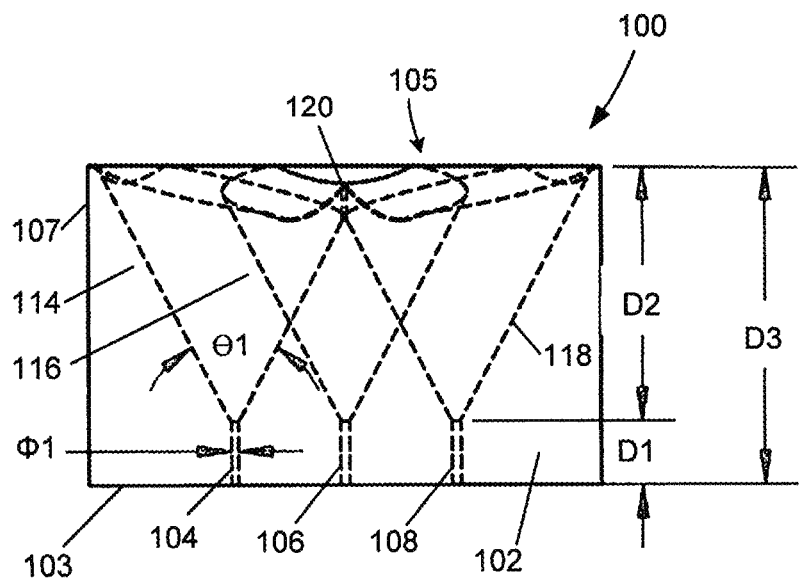
FIG. 2 illustrates a hidden line side view of a multi-inlet gas distributor for use with TRISO fuel particles according to various embodiments.
Figure 3:
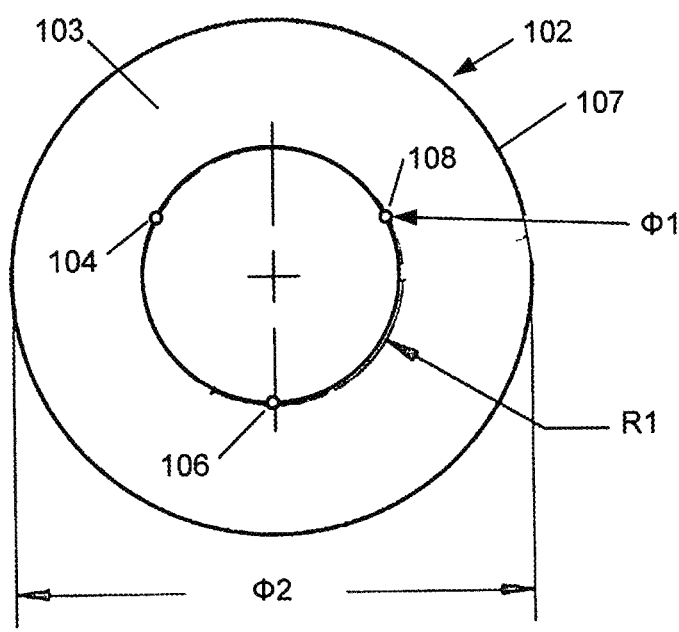
FIG. 3 illustrates a bottom view of a multi-inlet gas distributor for use with TRISO fuel particles according to various embodiments.

FIGS. 2 and 3 illustrate details of the multi-inlet gas distributor 100 according to various embodiments. The multi-inlet gas distributor 100 may include a distributor body 102 with the inlet surface 103, the exit surface 105 opposed to the inlet surface 103, and a side perimeter surface 107. The multi-inlet gas distributor 100 may include multiple-inlets 104, 106, 108 evenly spaced from each other. In various embodiments, the multiple-inlets 104, 106, 108 may be disposed symmetrically around a center of the inlet surface 103. In some embodiments, the multiple-inlets 104, 106, 108 may be evenly distributed along a radius R1 from the center of the inlet surface 103. The radius R1 may range from 0.5 inch±0.25 inches and preferably from 0.5 inch±0.0125 inches as shown in FIG. 3.

The multiple-inlets 104, 106, 108 may be manufactured by drilling pilot holes having inner diameters $\Phi 1$ ranging from about 0.015625 inches to about 0.0625 inches, and then drilling the pilot holes through to final diameters of approximately $7/64^{th}$ inch$+/-1/64^{th}$ inch for a two inch diameter multi-inlet gas distributor 100. The multiple-inlets 104, 106, 108 may be tubular and positioned about the multi-inlet gas distributor 100 in a variety of patterns such as circular, triangular, square, pentagonal, hexagonal, octagonal, multiple radial rows, or other polygons.

The inlet surface 103 and the exit surface 105, which are on opposite sides of the distributor body 102, may be bounded by the side perimeter surface 107 of the distributor body 102. The side perimeter surface 107 may form a variety of solid shapes. For example, the shape of a cross-section of the multi-inlet gas distributor 100 may a circle (as illustrated), a triangle, a square, a pentagon, a hexagon, an octagon, or another preferably regular polygon. The side perimeter surface 107 may have an outer diameter ($\Phi 2$) ranging from 2.0 inches±0.50 inches to about 6 inches±0.50 inches.

As illustrated in FIG. 2, the multiple-inlets 104, 106, 108 may extend from the inlet surface 103 through the distributor body 102 to an inlet depth D1 (i.e., a first depth) before connecting to or expanding into cone-shaped apertures 114, 116, 118. Each of the cone-shaped apertures 114, 116, 118 may join a corresponding one of the multiple-inlets 104, 106, 108 and have a same inner diameter $\Phi 1$ thereof at an inside end. From the inside end the cone-shaped apertures 114, 116, 118 may have an expanding diameter as they extend toward the exit surface 105. The inlet depth D1 may range from 0.25 inches±0.125 inches, and preferably from 0.25 inches±0.0625 inches. An overall depth D3 of the distributor body 102 may range from 1.25 inches±0.5 inches, and preferably from 1.25 inches±0.25 inches. Each of the three cone-shaped apertures 114, 116, 118 may connect to corresponding ones of the multiple-inlets 104, 106, 108 at the predetermined depth D1 and expand through a discharge depth D2 that is the difference between the overall depth D3 and the inlet depth D1. The cone-shaped apertures 114, 116, 118 may extend outward toward the exit surface 105 at a cone angle $\theta 1$. The cone angle $\theta 1$ may range from about 40° to about 60°, and preferably from about 45° to about 55°. The distributor body 102 also may have an apex 120 formed on the exit surface 105 positioned opposite the center of the inlet surface 103.

Figure 4:
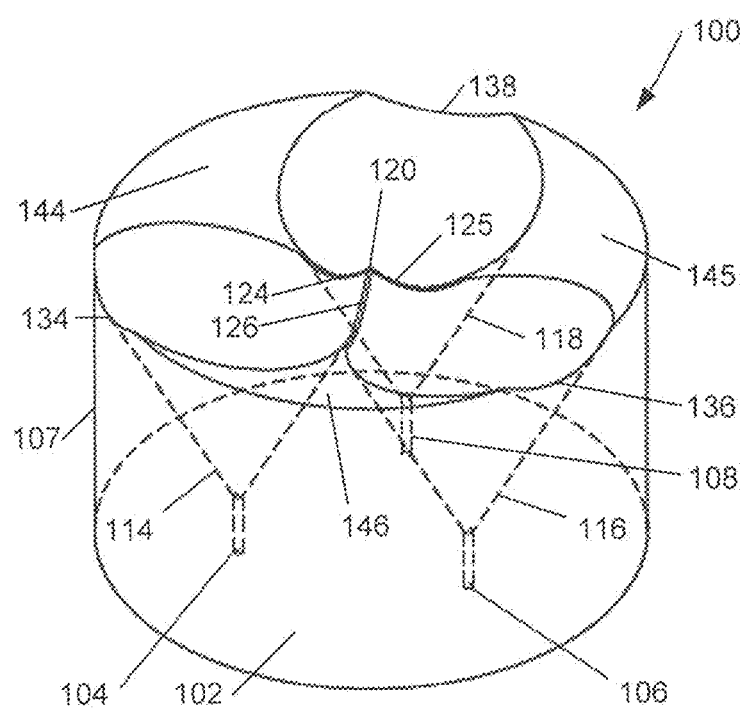
FIG. 4 illustrates a hidden line perspective view of a multi-inlet gas distributor for use with TRISO fuel particles according to various embodiments.
Figure 5:
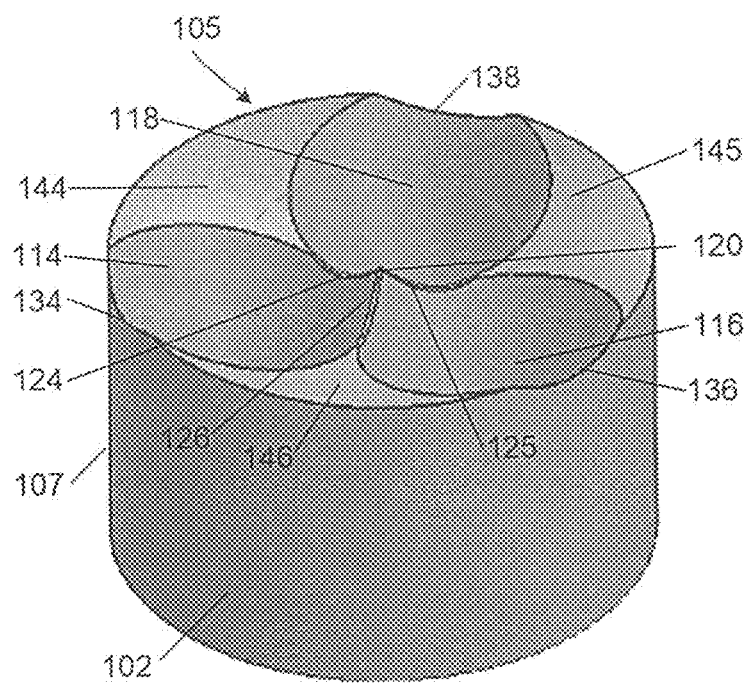
FIG. 5 illustrates a solid perspective view of a multi-inlet gas distributor of FIG. 4 according to various embodiments.

FIGS. 4 and 5 illustrate the multi-inlet gas distributor 100 according to various embodiments. The convergence of the cone-shaped apertures 114, 116, 118 at the center of the distributor body 102 may create apex ridges 124, 125, 126 that meet at the apex 120. Saddles 134, 136, 138 also may be formed at the intersection of the cone-shaped apertures 114, 116, 118 with the side perimeter surface 107, below the overall depth D3 of the distributor body 102. The saddles 134, 136, 138 may each form arch-shaped edges on the exit surface 105, extending between adjacent one of the shoulders 144, 145, 146. Additionally, shoulders 144, 145, 146 may be formed between the saddles 134, 136, 138 where two adjoining cone-shaped apertures intersect (e.g., 116 and 118), but do not also intersect with the side perimeter surface 107. The shoulders 144, 145, 146 may be planar and/or have a curved surface.

FIG. 4 shows the hidden lines of the multi-inlet gas distributor 100. The multi-inlet gas distributor 100 receives fluidizing gas/vapor at the multiple-inlets 104, 106, 108 at the required pressure and temperature. The fluidizing gas/vapor may flow through the inlets and the cone-shaped apertures 114, 116, 118 where the fluidizing gas/vapor expands and is directed into the fluidized bed chamber (e.g., 204 in FIG. 1). The cone-shaped apertures 114, 116, 118 may intersect forming the apex 120 and the apex ridges 124, 125, 126. The intersecting configuration of the cone-shaped apertures 114, 116, 118 may encourage a turbulent mixing of separate streams of the fluidizing gas/vapor emanating from the cone-shaped apertures 114, 116, 118. The saddles 134, 136, 138 also may direct the fluidizing gas/vapor streams directly to the walls of the fluidized bed chamber 204. The saddles 134, 136, 138 may improve the mixing along the walls of the fluidized bed chamber 204.

Figure 6:
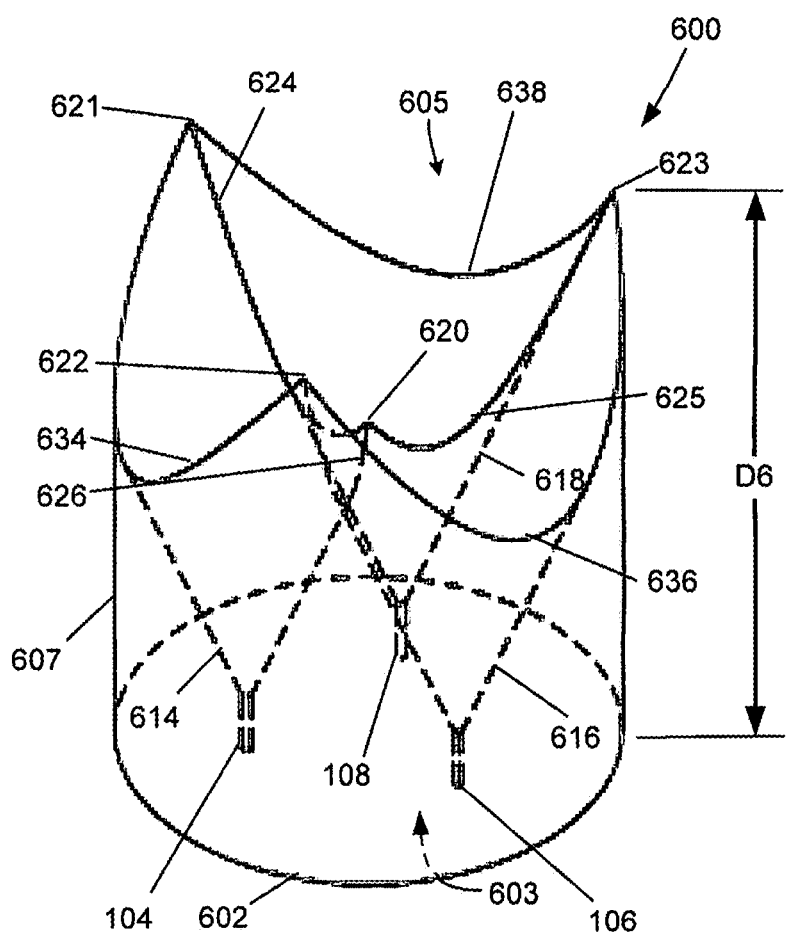
FIG. 6 illustrates another hidden line perspective view of another multi-inlet gas distributor for use with TRISO fuel particles according to various embodiments.

FIG. 6 illustrates a multi-inlet gas distributor 600 having a deeper distributor body 602, according to various embodiments. The deeper distributor body 602 may have a longer overall depth D6, ranging from 2.3 inches±0.5 inches and preferably from 2.3 inches±0.25 inches. Various other dimensions may remain the same as or similar to the dimensions described with reference to the distributor body 102 in FIGS. 2-4. The cone-shaped apertures 614, 616, 618 may extend outwardly from the multiple-inlets 104, 106, 108 toward an exit surface 605 at a predetermined angle (e.g., θ1 in FIG. 2) ranging from about 40° to about 60°, and preferably from about 45° to about 55°. The convergence of the cone-shaped apertures 614, 616, 618 at the center of the deeper distributor body 602 may create apex ridges 624, 625, 626 that project upward terminating at a central apex 620. Saddles 634, 636, 638 may also be formed at the intersection of the cone-shaped apertures 614, 616, 618 with a side perimeter surface 607, below the overall depth D6 of the deeper distributor body 602. The multi-inlet gas distributor 600 may include peaks 621, 622, 623 formed by the intersection of the cone-shaped apertures 614, 616, 618 with the side perimeter surface 607. Each peak 621, 622, 623 may be formed by the intersection of two adjoining ones of the cone-shaped apertures 614, 616, 618 with the side perimeter surface 607 of the deeper distributor body 602. In this way, a first peak 621 may be formed between a first pair of cone-shaped apertures 614, 618, a second peak 622 may be formed between a second pair of cone-shaped apertures 614, 618, and a third peak 623 may be formed between a third pair of cone-shaped apertures 616, 618. The first peak 621 may be disposed at the intersection of a first apex ridge 624, a first saddle 634, and a third saddle 638; the second peak 622 may be disposed at the intersection of a third apex ridge 626, the first saddle 634, and a second saddle 636; and the third peak 623 may be disposed at the intersection of a second apex ridge 625, a second saddle 636, and a third saddle 638. A distance between the inlet surface 603 and the three peaks 621, 622, 623 may define the overall depth D6 of the deeper distributor body 602. The central apex 620 may be disposed closer to the multiple-inlets 104, 106, 108 than the three peaks 621, 622, 623. In various embodiments the deeper distributor body 602 need not include shoulders formed between the saddles (e.g., the shoulders 144, 145, 146 formed between the saddles 134, 136, 138 in FIG. 4-5). The multi-inlet gas distributor 600 illustrated in FIG. 6 may improve the mixing of the fluidizing gas/vapor streams throughout the fluidized bed chamber (e.g., 204 in FIG. 1).

In some embodiments, the multi-inlet gas distributors 100, 600 may be made of various materials. In particular, the multi-inlet gas distributors 100, 600 may be comprised of graphite, aluminum, steel, titanium, alloy-steel, plastic, polymer, or other specialized material. The cone-shaped apertures 114, 116, 118, 614, 616, 618 may be configured to be "right circular cone" surfaces. However, in some embodiments, the cone-shaped surfaces may be oblique, elliptical, pyramidal, or polygonal cones.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the aspects and/or embodiments shown herein but is to be accorded the widest scope consistent with the following claims and the principles and novel features disclosed herein.

What is claimed is:

1. A multi-inlet gas distributor for a fluidized bed chemical vapor deposition chamber, comprising:
    a distributor body having an inlet surface, an exit surface opposed to the inlet surface, and a side perimeter surface extending between and connecting the inlet surface to the exit surface;
    multiple-inlets evenly spaced from each other, wherein the multiple-inlets penetrate the distributor body from the inlet surface to a first depth; and
    cone-shaped apertures connecting to corresponding ones of the multiple-inlets at the first depth and extend from the first depth toward the exit surface, wherein an apex is formed on the exit surface at an intersection of the cone-shaped apertures, and a saddle is formed with an arch-shaped edge along the exit surface at an intersection of at least one of the cone-shaped apertures with the side perimeter surface.

2. The multi-inlet gas distributor of claim 1, wherein an apex ridge is formed between the intersection of each of adjacent ones of the cone-shaped apertures.

3. The multi-inlet gas distributor of claim 2, where the apex ridge extends between the side perimeter surface and the apex.

4. The multi-inlet gas distributor of claim 1, wherein the multiple-inlets are evenly spaced from a center of the exit surface.

5. The multi-inlet gas distributor of claim 1, wherein shoulders are formed on the exit surface where two adjoining cone-shaped apertures intersect, but do not also intersect with the side perimeter surface.

6. The multi-inlet gas distributor of claim 1, wherein a peak is formed at an intersection of two adjoining ones of the cone-shaped apertures with the side perimeter surface.

7. The multi-inlet gas distributor of claim 1, wherein an overall thickness of the distributor body is between 1.25 and 2.30 inches.

8. The multi-inlet gas distributor of claim 1, wherein the first depth of the multiple-inlets is about 0.25 inches.

9. The multi-inlet gas distributor of claim 1, wherein an outside diameter of the multiple-inlets is about 7/64th inch.

10. The multi-inlet gas distributor of claim 1, wherein a radius of the distributor body between a center thereof and the side perimeter surface is about 0.5 inches.

11. The multi-inlet gas distributor of claim 1, wherein an outside diameter of the distributor body is between 2.0 inches and 6.0 inches.

12. The multi-inlet gas distributor of claim 1, wherein an outside diameter of the distributor body is about 2.0 inches.

13. The multi-inlet gas distributor of claim 1, wherein the cone-shaped apertures are right circular cones.

14. The multi-inlet gas distributor of claim 13, wherein the right circular cones have an interior angle of between 45° and 55°.

15. The multi-inlet gas distributor of claim 1, wherein a cross-section of the multi-inlet gas distributor has a shape selected from the group consisting of a circle, a triangle, a square, a pentagon, a hexagon, or an octagon.

16. The multi-inlet gas distributor of claim 1, wherein the distributor body is formed from one or more materials selected from the group consisting of graphite, aluminum, steel, titanium, alloy-steel, plastic, or polymer.

17. A fluidized bed chemical vapor deposition reactor, comprising:
    a fluidized bed chamber configured to hold fluidizing gas/vapor; and
    a multi-inlet gas distributor coupled to the fluidized bed chamber, wherein the multi-inlet gas distributor includes:
    a distributor body having an inlet surface, an exit surface opposed to the inlet surface, and a side perimeter surface extending between and connecting the inlet surface to the exit surface;
    multiple-inlets evenly spaced from each other, wherein the multiple-inlets penetrate the distributor body from the inlet surface to a first depth; and
    cone-shaped apertures connecting to corresponding ones of the multiple-inlets at the first depth and extend from the first depth toward the exit surface, wherein an apex is formed on the exit surface at an intersection of the cone-shaped apertures, and a saddle is formed with an arch-shaped edge along the exit surface at an intersection of at least one of the cone-shaped apertures with the side perimeter surface,
    wherein the multi-inlet gas distributor is configured to receive the fluidizing gas/vapor through the multiple-inlets and inject the fluidizing gas/vapor through the cone-shaped apertures and into the fluidized bed chamber.

18. The fluidized bed chemical vapor deposition reactor of claim 17, wherein shoulders are formed on the exit surface where two adjoining cone-shaped apertures intersect, but do not also intersect with the side perimeter surface.

19. The fluidized bed chemical vapor deposition reactor of claim 17, wherein a peak is formed at an intersection of two adjoining ones of the cone-shaped apertures with the side perimeter surface.

* * * * *